(12) United States Patent
Davis et al.

(10) Patent No.: US 9,092,357 B2
(45) Date of Patent: Jul. 28, 2015

(54) REMAPPING OF INOPERABLE MEMORY BLOCKS

(75) Inventors: John D. Davis, San Francisco, CA (US); Karin Strauss, Seattle, WA (US); Douglas C. Burger, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 511 days.

(21) Appl. No.: 12/915,025

(22) Filed: Oct. 29, 2010

(65) Prior Publication Data

US 2012/0110278 A1    May 3, 2012

(51) Int. Cl.
  *G06F 13/00*   (2006.01)
  *G06F 13/28*   (2006.01)
  *G06F 12/10*   (2006.01)
  *G06F 12/02*   (2006.01)
  *G11C 13/00*   (2006.01)
  *G11C 29/00*   (2006.01)

(52) U.S. Cl.
  CPC ........ *G06F 12/1027* (2013.01); *G06F 12/0292* (2013.01); *G06F 12/1009* (2013.01); *G11C 13/0004* (2013.01); *G11C 13/0035* (2013.01); *G11C 29/76* (2013.01); *G06F 2212/1044* (2013.01); *G06F 2212/2024* (2013.01)

(58) Field of Classification Search
  CPC ............ G06F 12/1027; G06F 12/1009; G06F 12/0292; G06F 2212/2024; G06F 2212/1044; G11C 29/76; G11C 13/0004; G11C 13/0035
  USPC ............................ 711/103, 156, 165, E12.103
  See application file for complete search history.

(56) References Cited

U.S. PATENT DOCUMENTS

| | | |
|---|---|---|
| 5,553,231 A | 9/1996 | Papenberg et al. |
| 6,754,784 B1 | 6/2004 | North et al. |
| 2010/0046292 A1* | 2/2010 | Hahn et al. ............... 365/185.09 |
| 2010/0142275 A1* | 6/2010 | Yogev et al. ............. 365/185.09 |
| 2010/0169602 A1 | 7/2010 | Hulbert et al. |
| 2012/0204071 A1* | 8/2012 | Abali et al. ................... 714/723 |

(Continued)

OTHER PUBLICATIONS

Ipek, et al., "Dynamically Replicated Memory: Building Reliable Systems from Nanoscale Resistive Memories", Retrieved at << http://www.cs.utexas.edu/ftp/pub/dburger/papers/ASPLOS10.pdf >>, Mar. 13-17, 2010, pp. 12.

(Continued)

*Primary Examiner* — Edward Dudek, Jr.
(74) *Attorney, Agent, or Firm* — Steve Wight; Judy Yee; Micky Minhas (57) ABSTRACT

Inoperable phase change memory (PCM) blocks in a PCM device are remapped to one or more operable PCM blocks, e.g. by maintaining an inoperable block table that includes an entry for each inoperable PCM block and an address of a remapped PCM block. Alternatively, the PCM blocks may be remapped by storing the address of the remapped block in the block itself, and setting a remapping bit that indicate the block has been remapped. Where the remapping is performed by a processor, an inoperable block bit may be set in a translation look aside buffer that indicates whether a virtual memory page is associated with an inoperable or remapped PCM block. When a request to access a virtual memory page is received, the processor references the inoperable block bit associated with the virtual memory page to determine whether to check for remapped PCM blocks in the inoperable block table.

19 Claims, 7 Drawing Sheets

(56) References Cited

U.S. PATENT DOCUMENTS

2012/0239854 A1* 9/2012 Hsueh et al. .................. 711/103
2012/0297258 A1* 11/2012 Flynn et al. .................. 714/710

OTHER PUBLICATIONS

Ferreira, et al., "Increasing PCM Main Memory Lifetime", Retrieved at << http://www.cs.pitt.edu/~childers/papers/DATE10-07.7_1_0447.pdf >>, Oct. 2007, pp. 6.

Dhiman, et al., "PDRAM: A Hybrid PRAM and DRAM Main Memory System", Retrieved at << http://seelab.ucsd.edu/papers/gdhiman_dac09.pdf >>, Jul. 26-31, 2009, pp. 6.

Narayanan, et al., "Migrating Server Storage to SSDs: Analysis of Tradeoffs", Retrieved at << http://citeseerx.ist.psu.edu/viewdoc/download?doi=10.1.1.150.2362&rep=rep1&type=pdf >>, Apr. 1-3, 2009, pp. 14.

Qureshi, et al., "Scalable High Performance Main Memory System Using Phase-Change Memory Technology", Retrieved at <<http://www.cs.ucsb.edu/~chong/290N/pcm.pdf >>, Jun. 20-24, 2009, pp. 10.

Zhang, et al., "Exploring Phase Change Memory and 3D Die-Stacking for Power/Thermal Friendly, Fast and Durable Memory Architectures", Retrieved at << http://www.ideal.ece.ufl.edu/publications/files/324-PACT-09.pdf >>, Aug. 2, 2010, pp. 12.

\* cited by examiner

REMAPPING OF INOPERABLE MEMORY BLOCKS

BACKGROUND

Phase change memory (PCM) is a potential replacement for dynamic random access memory (DRAM) in computers and other digital devices. Like other non-volatile memories, PCM has a limited lifetime or durability. Typically, one or more cells of the blocks of a PCM device may become inoperable and can no longer be reliably written to and/or read.

One solution is using error-correcting pointers (ECPs). However, ECPs are limited in the number of cell failures that can be corrected based on the total amount of memory available. Once this limit has been reached, subsequent cell failures may render an entire memory block unusable. Accordingly, the entire block may be discarded and any data in the block may have to be remapped. In the case where the PCM blocks are smaller than a virtual memory page, a single block failure may render an entire physical memory page unusable. When such errors occur during the runtime of an application, virtual page remapping may be needed for the application to continue executing, resulting in slower application performance, application crashes, or operating system crashes.

SUMMARY

Inoperable PCM blocks in a PCM device are determined by a PCM controller. The inoperable PCM blocks are remapped to one or more operable PCM blocks by either a processor or a PCM controller. The PCM blocks may be remapped by maintaining an inoperable block table that includes an entry for each inoperable PCM block and an address of a remapped PCM block. Alternatively, a PCM block may be remapped by storing the address of the remapped PCM block in the PCM block itself, and setting a remapping bit that indicates that the PCM block has been remapped. Where the remapping is performed by the processor, an inoperable block bit may be set in a translation look aside buffer that indicates whether a virtual memory page is associated with an inoperable or remapped PCM block. When a subsequent request to access a virtual memory page is received, the processor can reference the inoperable block bit associated with the virtual memory page to determine whether to check for remapped PCM blocks in the inoperable block table.

In an implementation, the first request to access a memory block is received by a memory controller. Whether the memory block is an inoperable memory block is determined by the memory controller. If it determined that the memory block is an inoperable memory block, whether the memory block has been remapped to a good/operable memory block is determined by the memory controller. If it is determined that the memory block has been remapped to the operable memory block, access to the operable memory block is provided by the memory controller.

In an implementation, a request to access a virtual memory page is received by a processor. The virtual memory page is associated with a plurality of memory blocks. Whether the virtual memory page is associated with one or more inoperable memory blocks is determined by the processor. If it is determined that the virtual memory page is associated with one or more inoperable memory blocks by the processor, the one or more memory blocks associated with the virtual memory page that are inoperable memory blocks are determined by the processor. For each of the one or more determined inoperable memory blocks, whether the inoperable memory block has been remapped to an operable memory block is determined by the processor, and if the inoperable PCM memory has been remapped to an operable memory block, access to the operable memory block is provided by the processor. If the inoperable memory block has not been remapped to an operable memory block, the inoperable memory block is remapped to an operable memory block and access to the operable memory block is provided by the processor. If it is not determined that the virtual memory page is associated with one or more inoperable memory blocks, access to the memory blocks associated with the virtual memory page is provided by the processor.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
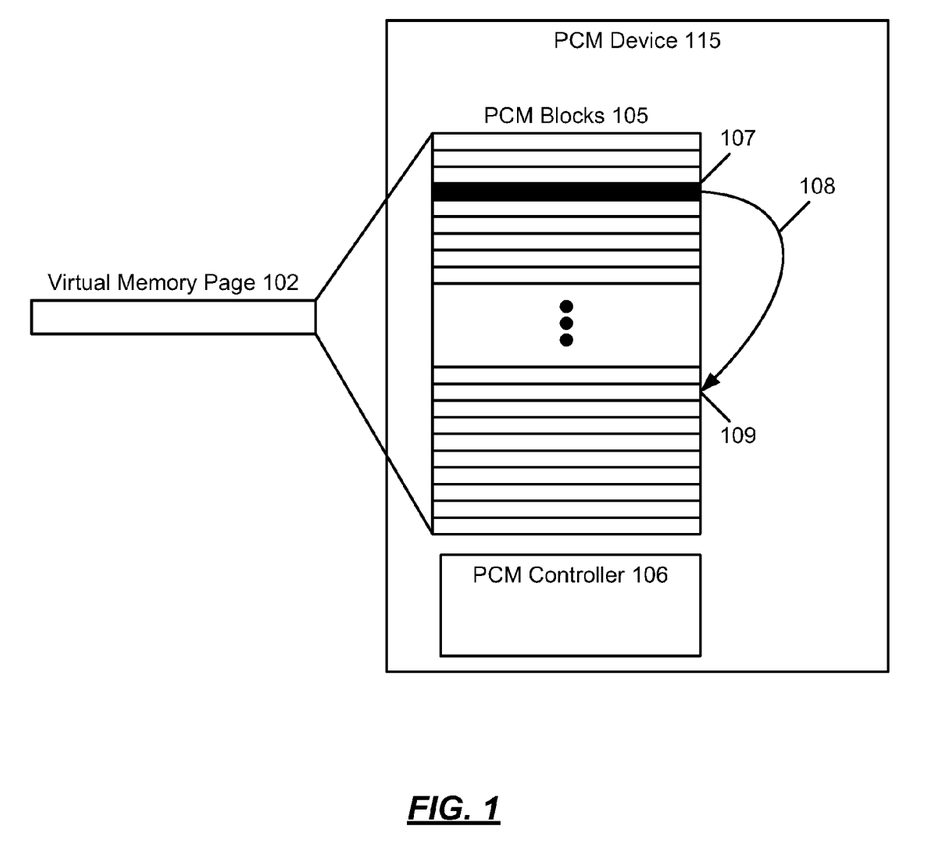
FIG. 1 is an illustration of an example virtual memory page that is mapped to one or more PCM blocks of a PCM device.

FIG. 1 is an illustration of an example virtual memory page 102 that is mapped to one or more PCM blocks 105 of a PCM device 115. One or more applications of an operating system may perform one or more memory operations to the virtual memory page 102. The operations may include writing data to the virtual memory page 102 and reading data from the virtual page 102. The virtual memory page 102 is called virtual because it does not physically exist, but is rather mapped to one or more of the PCM blocks 105. When a request to perform a memory operation at the virtual memory page 102 is received by the processor from an application, the PCM block of the PCM blocks 105 that are mapped to the virtual memory page 102 is determined and the memory operation is performed on the corresponding PCM block. The determination of the mapping may be made by the PCM controller 106 of the PCM device 115, or a processor of a computing device where the PCM device 115 resides, or is otherwise connected to, such as a computing system 700 described with respect to FIG. 7.

Each PCM block of the PCM blocks 105 may be made up of multiple PCM cells. Each cell may store a unit of data such as a single bit or multiple bits. Each PCM cell may be rated for approximately 100 million write cycles, for example, after which the PCM cell may become inoperable (i.e., fail) which means that the cell may no longer be written or read reliably by the PCM controller 106. In some implementations, a PCM block with an uncorrectable (i.e., failed) PCM cell is known as an inoperable PCM block. An uncorrectable cell is a cell that cannot be fixed using conventional error-correcting pointers ("ECP") or error-correcting codes. An example inoperable PCM block is illustrated in FIG. 1 as the PCM block 107.

In some implementations, the PCM controller 106 may detect that a cell in a PCM block is inoperable and may therefore determine that the entire PCM block 107 is inoperable. The PCM controller 106 may detect that a PCM block has become inoperable by writing to the PCM block and verifying how many cells of the PCM block cannot be written. If more cells cannot be written (i.e., are inoperable) than there are replacement cells within the PCM block and no other correction mechanism can correct the faulty cells, then the corresponding PCM block may be determined to be inoperable. Other methods for detecting an inoperable PCM block may be used.

In response to the determination that the PCM block is inoperable, the inoperable PCM block 107 may be remapped to another presumably operable PCM block. A PCM cell is "operable" if that the cell can be written and read reliably by the PCM controller 106. A PCM block having only operable PCM cells (cells that have not become inoperable or blocks that have operable replacement cells and have no inoperable or failed cells) is known as an operable PCM block. Memory accesses that were meant for the inoperable PCM block 107 may now be redirected to the operable PCM block. Remapping the PCM blocks may avoid costly remapping of virtual memory pages. Depending on the implementation, the remapping may be performed by the PCM controller 106 or a processor of a computing device. Alternatively, the PCM remapping may be performed by an operating system of the computing device.

For example, the PCM controller 106 may determine that the PCM block 107 is an inoperable PCM block. On determination that the PCM block 107 is an inoperable PCM block, the PCM controller 106 may generate a remapping 108 between the PCM block 107 and a PCM block 109. The remapping 108 may be stored in the remaining operable cells of the PCM block 107, or stored in a table or other data structure that includes each remapping and indicators of the inoperable PCM blocks. When a subsequent request for a memory operation is received for the virtual memory page 102, the portion of the request that relates to the inoperable PCM block 107 may be fulfilled from the remapped PCM block 109.

While the various implementations and examples listed herein are described with respect to PCM memory and PCM devices, they are not limited to only PCM memory or PCM devices. The implementations and examples are applicable to any one of a variety of types of non-volatile memory and memory devices such as flash memory, PROM, and MRAM, for example.

Figure 2:
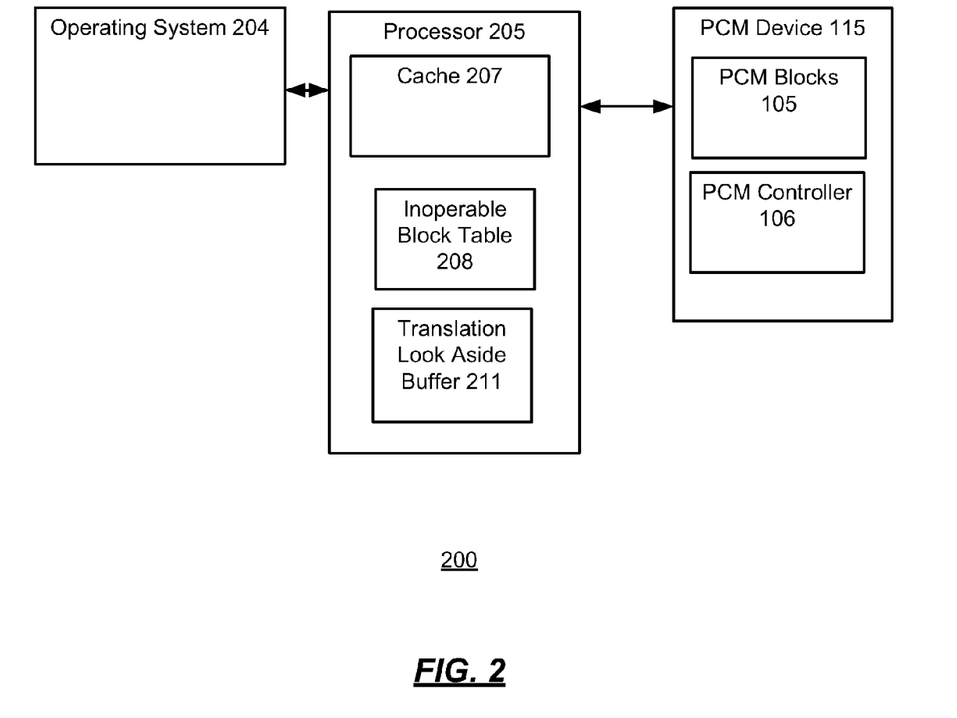
FIG. 2 is an illustration of an example environment for remapping PCM blocks by a processor.

FIG. 2 is an illustration of an example environment 200 for remapping PCM blocks by a processor. The environment 200 may include an operating system 204, a processor 205, and the PCM device 115. The processor 205 may include several components including, but not limited to, a cache 207, an inoperable block table 208, and a translation look aside buffer 211. The PCM device 115 may include several components including, but not limited to, the PCM blocks 105 and the PCM controller 106. More or fewer components may be supported by the processor 205 and/or the PCM device 115.

The operating system 204 or application may make one or more memory operation requests to the processor 205. The memory operation requests may be made to one or more virtual memory pages, and may include requests to write to, or read from, virtual memory pages. Each virtual memory page may be mapped to a subset of the PCM blocks 105. In some implementations, the mapping between the virtual memory pages and the PCM blocks 105 is cached by the translation look aside buffer 211. The translation look aside buffer 211 may store a data structure that is indexed by virtual memory addresses of the virtual memory pages. Each entry in the index may include addresses of PCM blocks from the PCM blocks 105 that correspond to the virtual memory page. The use of a translation look aside buffer 211 may increase the speed of virtual memory page address to physical memory page address translation by the processor 205.

When a request to perform a memory operation is received, the processor 205 may first attempt to fulfill the request from a cache 207 before going to the PCM device 115. If data corresponding to the virtual memory page is not in the cache 207 (i.e., there is a cache miss), then the processor 205 may fulfill the request from the PCM device 115. As described above, the processor 205 may determine the particular PCM blocks that correspond to the virtual memory page by referencing the translation look aside buffer 211.

After determining the PCM blocks corresponding to the virtual memory page, the processor 205 may determine if one or more of the corresponding PCM blocks are inoperable PCM blocks. In some implementations, the processor 205 may determine if there are any inoperable PCM blocks associated with the virtual memory page by referencing an inoperable block bit associated with the virtual memory page in the translation look aside buffer 211. Depending on the type of processor 205 used, the translation look aside buffer 211 may support an additional bit (i.e., the inoperable block bit) that may be set when any of the PCM blocks corresponding to the virtual memory page are known to be inoperable. Because the majority of virtual memory pages may not be associated with any inoperable PCM blocks, by referencing the inoperable block bit, the processor 205 may avoid any additional steps or operations that may be necessary to determine which of the PCM blocks are inoperable.

If the inoperable block bit indicates that there is an inoperable PCM block associated with the virtual memory page, or in implementations where no inoperable block bit is available, the processor 205 may determine which, if any, of the PCM blocks associated with the virtual memory page are inoperable PCM blocks. In some implementations, the processor 205 may determine which PCM blocks are inoperable using an inoperable block table 208. The inoperable block table 208 may be a table, or other data structure, that is indexed using identifiers of the PCM blocks 105. The identifiers may be addresses, for example. The inoperable block table 208 may include an entry for each block in the PCM blocks 105, along with an indicator of whether the block is operable or inoperable. Alternatively, the inoperable block table 208 may include only an entry for known inoperable blocks.

In some implementations, the processor 205 may maintain the entire inoperable block table 208 in memory. In other implementations, the processor 205 may keep only a portion of the inoperable block table 208 in memory at a time. For example, the processor 205 may load the portion of the inoperable block table 208 corresponding to the PCM blocks associated with the virtual memory page being considered.

If the inoperable block table 208 indicates that a PCM block corresponding to the virtual memory page is inoperable, then the processor 205 may determine a remapping of the PCM block. In some implementations, the remapping may comprise an address of a new PCM block that the inoperable PCM block has been remapped to. The inoperable PCM block may have been remapped to the new PCM block by a remapping function. The remapping function may use a variety of remapping techniques including adding a memory offset to the address of the inoperable PCM block or using a hash function. The remapping function may be static or dynamic, depending on the implementation. An advantage of using a dynamic function may be that the remappings associated with the PCM blocks 105 may be changed to account for any wear leveling performed by the PCM device 115. In addition, the use of static functions may result in remapping chains which are illustrated and described further with respect to FIG. 4.

In some implementations, the address of a remapped inoperable PCM block may be determined by the processor 205 using the inoperable block table 208. Alternatively or additionally, the processor 205 may use the remapping function to determine the address of the remapped PCM block.

In other implementations, rather than use an inoperable block table 208 and/or the inoperable block bit of the translation look aside buffer 211, an indicator of whether a PCM block is an inoperable PCM block may be stored in the PCM block itself. For example, each PCM block may support what is referred to herein as a remapping bit. The remapping bit may be an ECP bit and may indicate whether the PCM block is inoperable and has been remapped. In addition, when the remapping bit is set, the inoperable PCM block may store the address or other indicator of a new PCM block that the inoperable PCM block has been remapped to. As described above, a PCM block is considered inoperable when it suffers an uncorrectable single cell failure. Thus, the address of the remapped PCM block may be stored in the portions of the inoperable PCM block that are still functional or stored redundantly in the block to tolerate cell failures.

In such implementations, the processor 205 may determine that a PCM block associated with a virtual memory page is an inoperable PCM block when the processor 205 reads the remapping bit. The processor 205 may then retrieve the address of the remapped PCM block from the inoperable PCM block. Alternatively or additionally, where the PCM block is too badly damaged to store the remapped address, the processor 205 may use the remapping function to determine the address.

The processor 205 may further manage the remapping of the inoperable PCM blocks in the PCM blocks 105. The PCM controller 106 may provide an indicator that one or more of the blocks 105 have become inoperable to the processor 205. The processor 205 may then perform one or more of several operations depending on the implementation. For example, in implementations that support the inoperable block bit of the translation look aside buffer 211, the processor 205 may mark the inoperable block bit corresponding to the virtual memory page associated with the inoperable PCM block. In implementations using the inoperable block table 208, the processor 205 may make an entry for the inoperable PCM block, or may set a bit in the entry for the inoperable PCM block indicating that the PCM block is inoperable. Further, in implementations where the remapping is stored in the inoperable PCM blocks, the processor 205 may set the remapping bit in the inoperable PCM block to indicate that it is (or needs to be) remapped.

The processor 205 may further remap the inoperable PCM block to another PCM block. In some implementations, the processor 205 may remap the inoperable block around the same time that it is determined that the PCM block is inoperable.

The processor 205 may remap the PCM block using a remapping function. As described previously, the remapping function may calculate an address for a remapped block using a hash function or a memory offset function, for example. In implementations using an inoperable block table 208, the processor 205 may add the address of the remapped block to the inoperable block table 208 in an entry for the address of the inoperable PCM block. In implementations where the addresses of the remapped blocks are stored in the inoperable blocks themselves, the processor 205 may add the address of the remapped block to the inoperable block and set the remapping bit.

Figure 3:
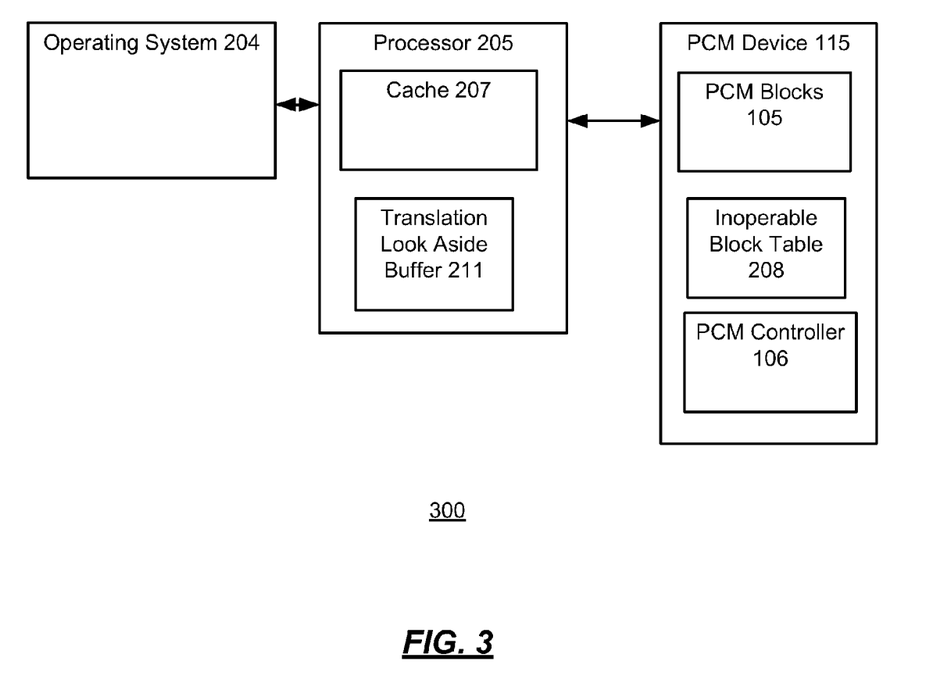
FIG. 3 is an illustration of an example environment for remapping PCM blocks by a controller of PCM device.

FIG. 3 is an illustration of an example environment 300 for remapping PCM blocks by a PCM controller. The environment 300 may be similar to the environment 200 and may include the operating system 204, the processor 205, and the PCM device 115. The processor 205 may include several components including, but not limited to, the cache 207 and the translation look aside buffer 211. The PCM device 115 may include several components including, but not limited to, the PCM blocks 105, the PCM controller 106, and the inoperable block table 208. More or fewer components may be supported by the processor 205 and/or the PCM device 115.

The environment 300 may be substantially similar to the environment 200, except, rather than the remapping of one or more PCM blocks being handled by the processor 205, in the environment 300 the remapping is performed by the PCM controller 106. Accordingly, the PCM device 115 may maintain the inoperable block table 208.

Similarly to the environment 200, the operating system 204 or application may make one or more memory operation requests to the processor 205 for a virtual memory page. On detecting a cache 207 miss, the processor 205 may use the translation look aside buffer 211 to determine one or more PCM blocks of the PCM blocks 105 corresponding to the virtual memory page. The processor 205 may then generate and send a request to access the determined one or more PCM blocks to the PCM controller 106.

The PCM controller 106 may receive the request for access to the one or more PCM blocks, and may determine if any of the PCM blocks associated with the virtual memory page are inoperable blocks, and therefore need to be remapped, or have already been remapped to other PCM blocks. Unlike the implementation described with respect to the environment 200, because the remapping functions are maintained and performed by the PCM controller 106, rather than the processor 205, the inoperable block bit of the translation look aside buffer 211 may not be available to the PCM controller 106 to determine if a virtual memory request is associated with an inoperable PCM block or an otherwise remapped PCM block. Thus, in some implementations, the PCM controller 106 may determine if one or more of the PCM blocks associated with memory request are inoperable or remapped blocks using the inoperable block table 208. The inoperable block table 208 may be stored at the PCM device 115 as illustrated, or at some other location that is accessible to the PCM controller 106.

For example, the PCM controller 106 may look up each PCM block associated with the virtual memory page in the inoperable block table 208 using the address of each PCM block, and may determine if the PCM block is inoperable and/or the PCM block needs to be remapped. Similarly as described with respect to the processor 205, the PCM controller 106 may retrieve the entire inoperable block table 208 at once, or may only retrieve the portions of the inoperable block table 208 that are relevant to the PCM blocks associated with the virtual memory page.

If the PCM blocks associated with the virtual memory page are determined to all be operable PCM blocks, the PCM controller 106 may provide access to the PCM blocks, or may provide one or more values stored in the PCM blocks to the processor 205 to perform the requested memory operation. If one or more of the PCM blocks associated with the memory page are inoperable and have been remapped, the PCM controller 106 may determine remapped addresses for the one or more PCM blocks from the inoperable block table 208, or alternatively, using the remapping function. The PCM controller 106 may then perform the memory operation on the remapped one or more PCM blocks, or may provide one or more values stored in the remapped PCM blocks to the processor 205 to perform the memory operation. If one or more of the PCM blocks are inoperable, but have not yet been remapped, the PCM controller 106 may use the remapping function to generate a remapped address for the inoperable PCM block. The remapped address may be stored in the inoperable block table 208.

In some implementations, similarly as described above for the environment 200, the PCM controller 106 may not use an inoperable block table 208, but may rather store the remapped address for an inoperable block in the inoperable block itself. The PCM controller 106 may further set an indicator that the block has been remapped such as a remapping bit. The remapping bit may be an ECP bit, for example. In some implementations, the inoperable block table 208 may be stored in a region of the PCM device or other available persistent storage.

Figure 4:
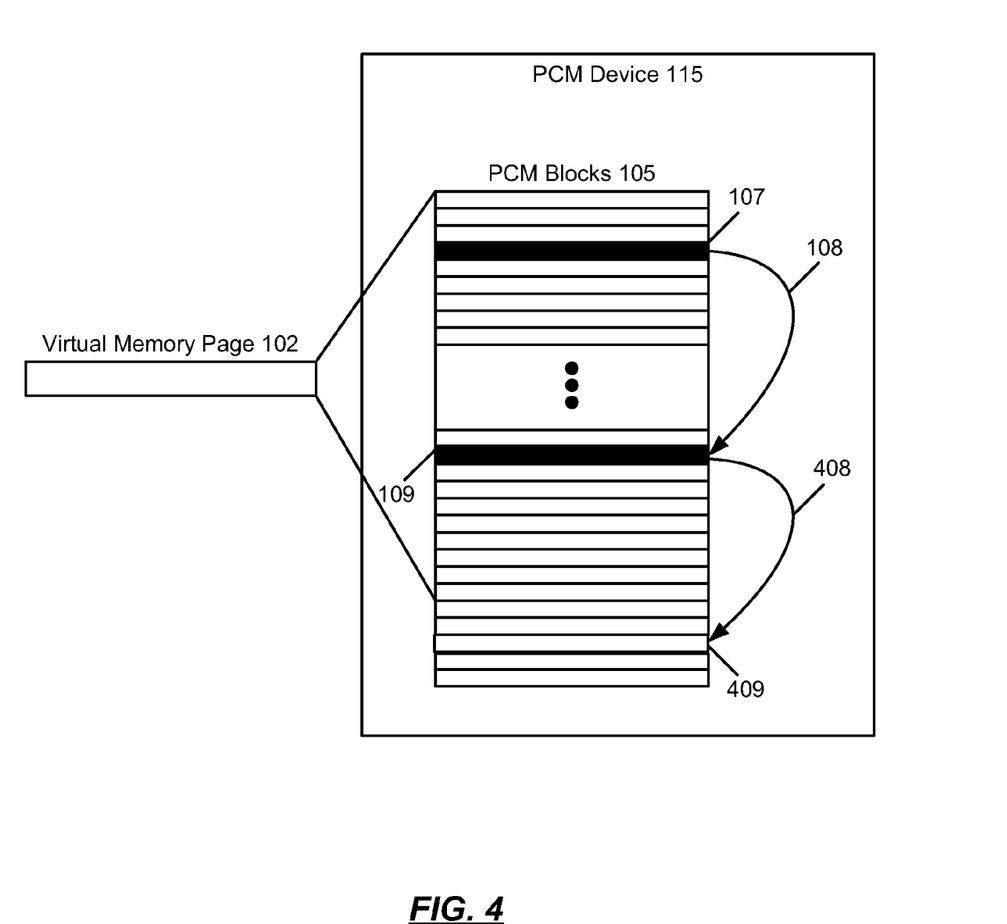
FIG. 4 is an illustration of an example remapping chain resulting from a static remapping function.

FIG. 4 is an illustration of an example remapping chain resulting from a static remapping function. As described above, the use of a static remapping function may result in a remapping chain. For example, the PCM block 107 may be determined to be an inoperable PCM block and may be remapped, through the remapping 108, to the PCM block 109. At a later time, the PCM block 109 may also be determined to be an inoperable PCM block and may also have been remapped, using a remapping 408, to a PCM block 409. In both cases, the remappings 108 and 408 were generated using a static remapping function. The sequence of remappings created by the remappings 108 and 408 is an example of a remapping chain.

Such remapping chains may create additional steps or operations, and add additional overhead, to memory operations on the virtual memory page 102. For example, when a request to access the virtual memory page 102 is received, the PCM controller 106 and/or the processor 205 may have to reference the inoperable blocks table 208 for both the PCM block 107 and the PCM block 109 to reach the end of the remapping chain. Where the address of a remapped inoperable PCM block is stored in the PCM block, the PCM controller 106 and/or the processor 205 may follow the remapping chain until a PCM block is reached where the remapping bit is not set.

One solution to the remapping chains is the use of levels within the static remapping function. The static remapping function may take an address of a inoperable PCM block, along with a level number that is based on the number of times that the inoperable PCM block has been remapped (i.e., the length of the remapping chain), and may generate the remapped address based on the address of the inoperable block and the level number. The level number may then be stored with the remapped address for the inoperable PCM block in the inoperable block table 208, or in the inoperable block itself. On any subsequent remapping of the remapped PCM block, the level number may be incremented.

When a request for access to the inoperable PCM block is received, the PCM controller 106 and/or the processor 205 may determine that the PCM block is inoperable using the inoperable block table 208 and/or the remapping bit of the PCM block itself. However, where the level number indicates that there is a remapping chain (i.e., a level number greater than one), the PCM controller 106 and/or the processor 205 may determine the address of the remapped PCM block using the address of the inoperable PCM block and the level number, rather than following the remapping chain.

Figure 5:
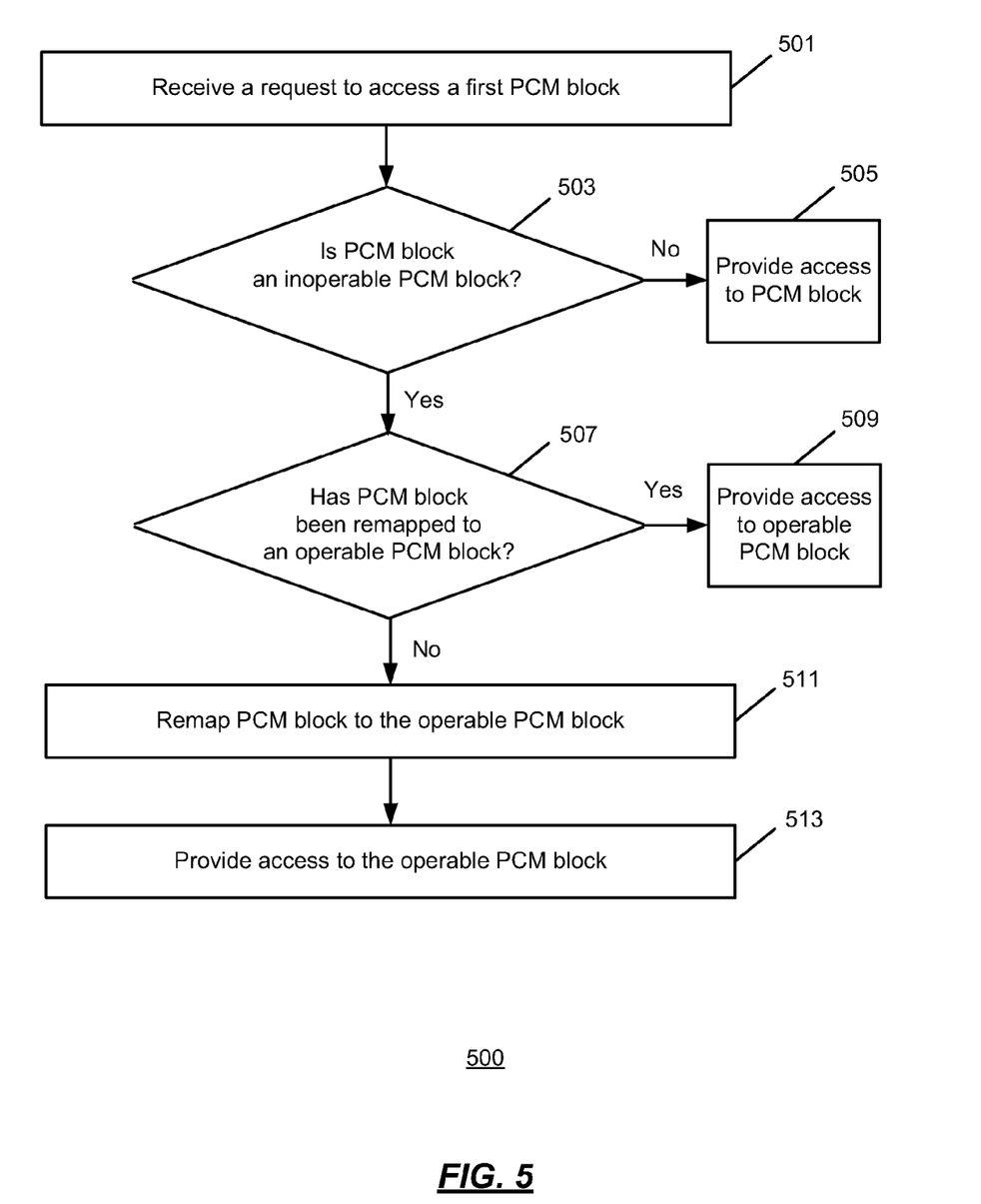
FIG. 5 is an operational flow of an implementation of a method for providing access to a PCM block.

FIG. 5 is an operational flow of an implementation of a method 500 for providing access to a PCM block. The method 500 may be implemented by the PCM controller 106. While the method 500 is described with respect to PCM blocks and PCM controllers, it is applicable to any type of non-volatile memory blocks and/or memory controllers.

A request to access a PCM block is received at 501. The request may be received by the PCM controller 106 from the processor 205. In some implementations, the request may be received in response to a request to perform a memory operation on a virtual memory page. The PCM block may be associated with a virtual memory page.

A determination is made as to whether the PCM block is an inoperable PCM block at 503. The determination maybe made by the PCM controller 106. In some implementations, the PCM controller 106 may determine if the PCM block is an inoperable PCM block by referencing an inoperable block table 208, or other data structure, that maintains a list of the inoperable blocks in the PCM device 115. In other implementations, the PCM controller 106 may determine if the PCM block is inoperable by accessing the PCM block and determining if a remapping bit (such as an ECP bit) has been set. If it is determined that the PCM block is an inoperable PCM block, then processing may continue at 507. Otherwise, the PCM block is an operable PCM block, and the PCM controller 106 may provide access to the PCM block at 505.

At 507, a determination is made as to whether the PCM block has been remapped to an operable PCM block. The determination may be made by the PCM controller 106. In some implementations, the determination may be made by the PCM controller 106 by referencing the inoperable block table 208, or other data structure, using the address of the PCM block. In other implementations, where the remapping bit has been set, the PCM controller 106 may determine if an address of the operable PCM block has been stored in the PCM block. If the PCM block has been remapped to the operable PCM block, then the method 500 may provide access to the operable PCM block at 509. Otherwise, processing may continue at 511.

The PCM block is remapped to the operable PCM block at 511. The PCM block may be remapped to the operable PCM block by the PCM controller 106. An address of the operable block may be determined using the remapping function, and the determined address may be added to the inoperable block table 208 in an entry associated with the PCM block. Alternatively or additionally, the address of the operable PCM block may be stored in the PCM block.

Access is provided to the operable PCM block at 513. The access may be provided the PCM controller 106. In some implementations, the access provided may be to perform a memory operation.

Figure 6:
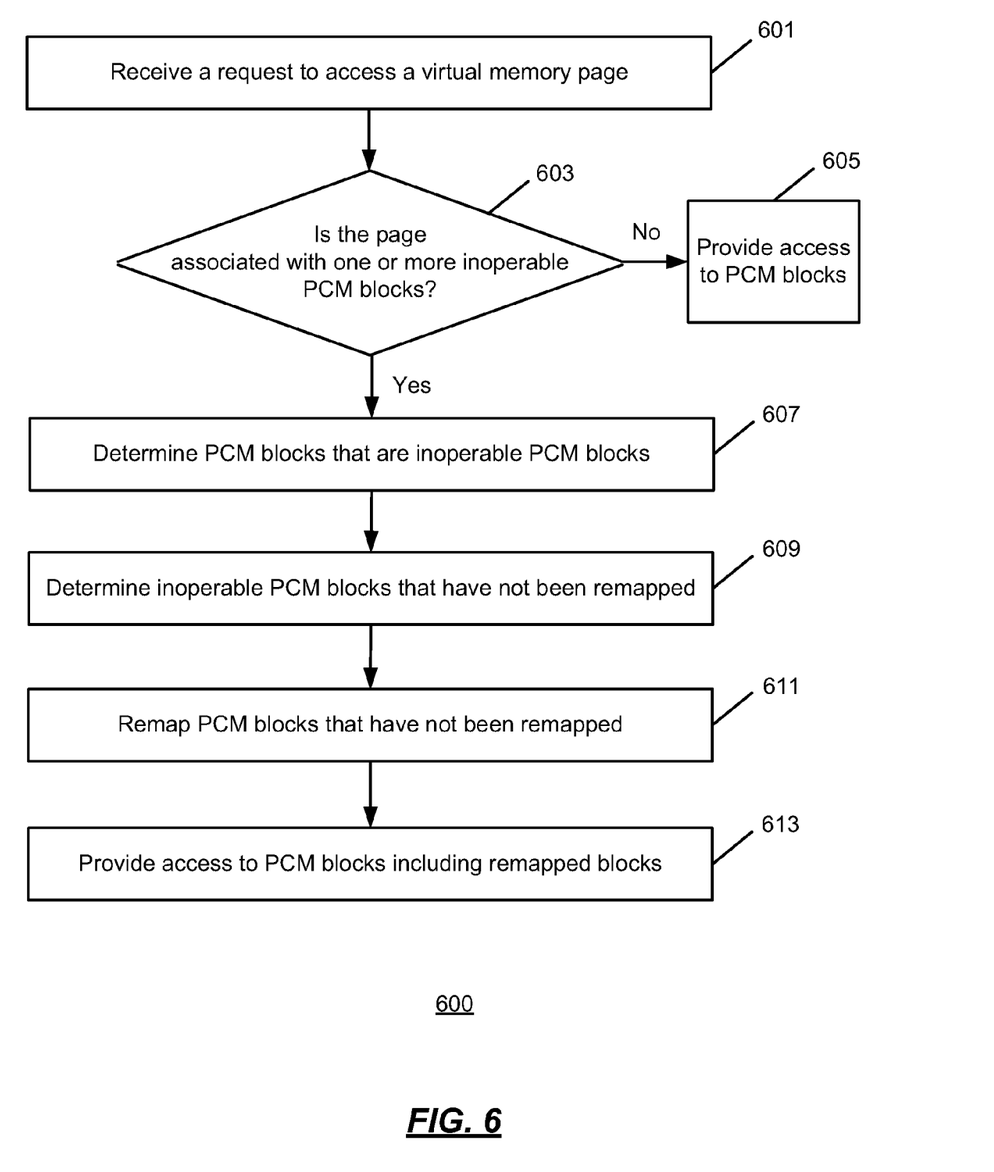
FIG. 6 is an operational flow of another implementation of a method for providing access to a PCM block.

FIG. 6 is an operational flow of another implementation of a method 600 for providing access to a PCM block. The method 600 may be implemented by the processor 205. While the method 600 is described with respect to PCM blocks, it is applicable to any type of non-volatile memory blocks.

A request to access a virtual memory page is received at 601. The request may be received by the processor 205. The virtual memory page may be mapped to, or associated with, one or more PCM blocks.

A determination is made as to whether the virtual memory page is associated with any inoperable PCM blocks at 603. The determination may be made by the processor 205. In some implementations, the processor 205 may make the determination using a translation look aside buffer 211. The translation look aside buffer 211 may include an inoperable block bit, or other data structure, for each virtual memory page that indicates whether the virtual memory page is associated with any inoperable PCM blocks. The inoperable block bit may have been set when an inoperable PCM block was previously determined by the PCM controller 106 and/or the processor 205. If the virtual memory page is not associated with any inoperable PCM blocks, then processing may continue to 605 where the processor 205 may provide access (e.g., via the PCM controller 106) to the PCM blocks associated with the virtual memory page. Otherwise, processing may continue at 607.

At 607, the PCM blocks associated with the virtual memory page that are inoperable PCM blocks are determined. In some implementations, the inoperable PCM blocks may be determined by the processor 205 using an inoperable block table 208, or other data structure, that has an entry for each inoperable block in the PCM device 115. For example, the processor 205 may search for an address associated with each PCM block in the inoperable block table 208.

The inoperable PCM blocks that have not yet been remapped are determined at 609. The PCM blocks may be determined by the processor 205.

The inoperable PCM blocks that have not yet been remapped are remapped at 611. The inoperable PCM blocks may be remapped by the processor 205 using a remapping function such as a hash table or a memory offset generating function. The remapping function may generate a remapping such as a new address for each inoperable PCM block. The new address may be an address of an operable PCM block. The new addresses may be stored in the inoperable block table 208 in an entry corresponding to their respective inoperable PCM block.

Access to the PCM blocks is provided at 613. The access may be provided by the processor 205 via the PCM controller 106.

Figure 7:
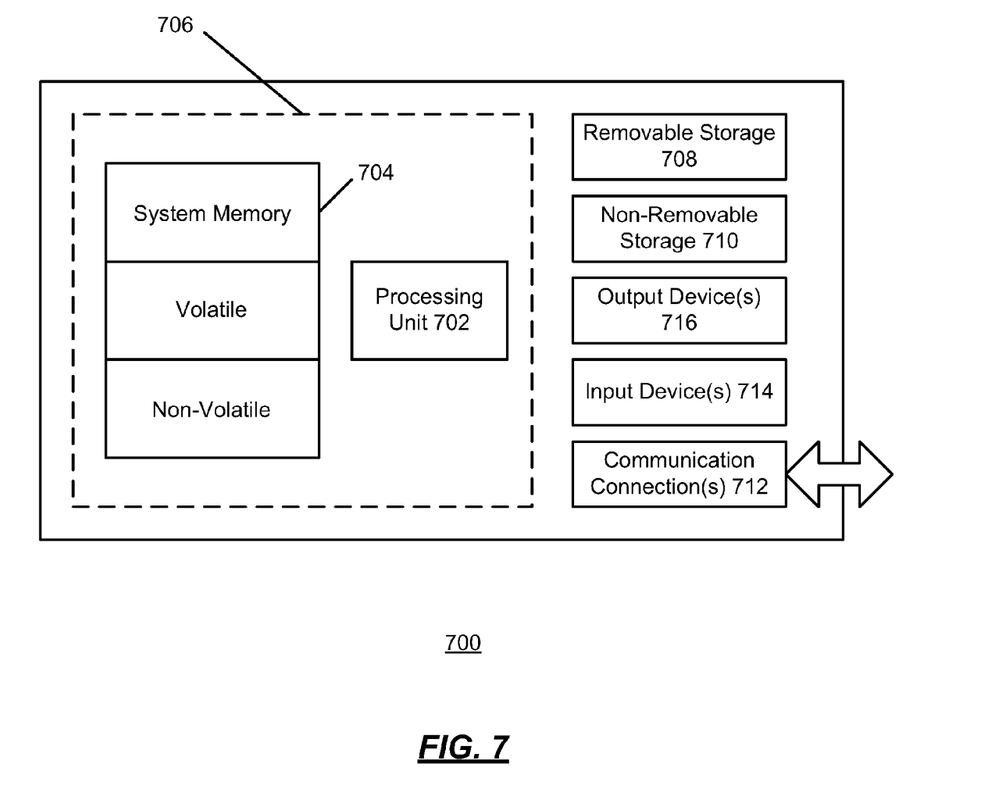
FIG. 7 is a block diagram of a computing system environment according to an implementation of the present system.

FIG. 7 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, personal computers, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 7, an exemplary system for implementing aspects described herein includes a computing device, such as computing system 700. In its most basic configuration, computing system 700 typically includes at least one processing unit 702 and memory 704. Depending on the exact configuration and type of computing device, memory 704 may be volatile (such as random access memory (RAM)), non-volatile (such as read-only memory (ROM), flash memory, etc.), or some combination of the two. This most basic configuration is illustrated in FIG. 7 by dashed line 706.

Computing system 700 may have additional features/functionality. For example, computing system 700 may include additional storage (removable and/or non-removable) including, but not limited to, magnetic or optical disks or tape. Such additional storage is illustrated in FIG. 7 by removable storage 708 and non-removable storage 710.

Computing system 700 typically includes a variety of computer readable media. Computer readable media can be any available media that can be accessed by computing system 700 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 704, removable storage 708, and non-removable storage 710 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system 700. Any such computer storage media may be part of computing system 700.

Computing system 700 may contain communications connection(s) 712 that allow the device to communicate with other devices. Computing system 700 may also have input device(s) 714 such as a keyboard, mouse, pen, voice input device, touch input device, etc. Output device(s) 716 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving in a memory controller, a request to access a first memory block in a plurality of memory blocks;
   determining if the first memory block in the plurality of memory blocks is one of an inoperable memory block or an operable memory block, the inoperable memory block comprising a number of inoperable cells inside the inoperable memory block exceeding a threshold value;
   if the first memory block is an inoperable memory block:
      accessing a table located outside the plurality of memory blocks; and
      determining if the table contains a remapping address indicative of a remapping of the inoperable memory block to a second memory block in the plurality of memory blocks; and
   loading into a processor, only a portion of the table, the portion of the table containing a plurality of memory blocks that are associated with a virtual memory page currently being operated upon by the processor.

2. The method of claim 1,
   wherein the threshold value is based on a number of replacement cells available inside the inoperable memory block,
   wherein the second memory block is an operable memory block, and
   wherein the remapping address is associated with the operable memory block.

3. The method of claim 1, wherein determining if the first memory block is an inoperable memory block comprises determining if a remapping bit has been set in the first memory block.

4. The method of claim 3, wherein the remapping bit comprises an error-correcting pointer (ECP) bit.

5. The method of claim 1, wherein the second memory block is an operable memory block and further comprising:
   determining an address of the operable memory block by reading the address of the operable memory block from the table.

6. The method of claim 1, wherein the memory controller is a phase change memory (PCM) controller, and at least one of the first or the second memory block is a PCM block.

7. The method of claim 1, further comprising, if it is determined that the inoperable memory block has not been remapped to the second memory block:
   selecting an address for the second memory block; and
   adding the address to the table.

8. The method of claim 1, further comprising if the inoperable memory block has not been remapped to the second memory block:
   selecting an address for the second memory block; and
   storing the selected address in the inoperable memory block.

9. A method comprising:
   receiving a request to access a virtual memory page by a processor, wherein the virtual memory page is associated with a plurality of memory blocks;
   determining, by the processor, if the virtual memory page is associated with one of an inoperable memory block or an operable memory block, the determining comprising checking an inoperable block bit in a translation look aside buffer located outside the plurality of memory blocks, wherein the inoperable block bit is in a set condition when one or more of the plurality of memory blocks of the virtual memory page is inoperable, wherein the one or more of the plurality of memory blocks that is inoperable comprises virtual memory; and
   loading into the processor, a portion of an inoperable block table located outside the plurality of memory blocks, the portion of the inoperable block table containing the plurality of memory blocks that are associated with the virtual memory page being operated upon by the processor.

10. The method of claim 9, wherein the memory blocks comprise phase change memory (PCM) blocks.

11. The method of claim 9, further comprising:
    when the one or more of the plurality of memory blocks of the virtual memory page is inoperable:
       identifying an inoperable memory block;
       determining if the inoperable memory block has been remapped to an operable memory block by the processor;
       if the inoperable memory block has been remapped to an operable memory block, providing access to the operable memory block by the processor; and
       if the inoperable memory block has not been remapped to an operable memory block, remapping the inoperable memory block to an operable memory block and providing access to the operable memory block by the processor.

12. The method of claim 11, wherein determining if the inoperable memory block has been remapped comprises looking up the inoperable block table.

13. The method of claim 11, wherein remapping the inoperable memory block to an operable memory block comprises:
    generating an address of the operable memory block using a remapping function and an address of the inoperable memory block; and
    adding the generated address to an entry associated with the inoperable memory block in the inoperable block table.

14. The method of claim 13, wherein the remapping function is one of a hashing function or a memory offset calculating function.

15. The method of claim 11, wherein remapping the inoperable memory block to an operable memory block comprises:
    generating an address of the operable memory block using a remapping function and an address of the inoperable memory block; and
    storing the generated address in the inoperable memory block.

16. A system comprising:
    a memory module comprising a plurality of memory blocks configured as a virtual memory page; and
    a memory controller adapted to:
       receive a request to access the virtual memory page;

access a translation look aside buffer located outside the virtual memory page to determine if an inoperable block bit in the translation look aside buffer is in a set condition, wherein the set condition is indicative that one or more of the plurality of memory blocks of the virtual memory page is inoperable, wherein the one or more of the plurality of memory blocks that is inoperable comprises virtual memory;

if the inoperable block bit is in the set condition:
determine if an inoperable memory block has been remapped to an operable memory block from the plurality of memory blocks; and
if the inoperable memory block has been remapped to the operable memory block, provide access to the operable memory block; and load into a processor, a portion of an inoperable block table located outside the plurality of memory blocks, the portion of the inoperable block table containing the plurality of memory blocks that are associated with the virtual memory page being operated upon by the processor.

17. The system of claim 16, wherein the inoperable block table is located outside the virtual memory page, the inoperable block table having stored therein, at least one remapping entry corresponding to the inoperable memory block.

18. The system of claim 16, wherein the memory controller is adapted to identify the inoperable memory block by accessing the inoperable memory block to determine if a remapping bit has been set.

19. The system of claim 18, wherein the remapping bit comprises an additional error-correcting pointer (ECP) bit.

* * * * *